United States Patent [19]

Leleu et al.

[11] 4,224,672
[45] Sep. 23, 1980

[54] PERTURBATION SIGNAL RECORDER

[75] Inventors: René O. Leleu, Versailles; Pierre J. B. Cormault, Fourqueux, both of France

[73] Assignees: Electricite de France; Chiarelli Etudes et Realisations Mecaniques et Electroniques, both of France

[21] Appl. No.: 43,483

[22] Filed: May 29, 1979

[30] Foreign Application Priority Data

Apr. 17, 1979 [FR] France .................................. 79 09614

[51] Int. Cl.² .......................... G01D 9/00; G01D 4/10
[52] U.S. Cl. .................................. 346/33 R; 364/483
[58] Field of Search ................. 346/33 R, 33 EC UX; 364/483, 486

[56] References Cited

U.S. PATENT DOCUMENTS

| | | | |
|---|---|---|---|
| 3,363,226 | 1/1968 | Murphree | 346/33 EC UX |
| 3,566,392 | 2/1971 | Jones et al. | 346/33 R X |
| 3,676,649 | 7/1972 | Burk | 364/483 X |
| 3,825,935 | 7/1974 | Kortman | 346/34 |
| 3,936,740 | 2/1976 | Hogg et al. | 364/486 X |
| 4,050,057 | 9/1977 | Backman Jr. et al. | 346/33 EC X |
| 4,062,020 | 12/1977 | Berglund | 346/33 R |

Primary Examiner—George H. Miller, Jr.
Attorney, Agent, or Firm—Schwartz, Jeffery, Schwaab, Mack, Blumenthal & Koch

[57] ABSTRACT

The invention relates to a perturbation signal recorder. An input circuit receives a series of signals to be monitored and samples them in order to supply in respect of each sample a digital word to a pre-memory circuit which preserves the n most recent digital words. In the presence of a perturbation, a central unit excites a main memory circuit in order that it records the n most recent digital words at the time of the perturbation, as well as the following digital words during and after the perturbation. The contents of the main memory are thus transferred at a slow rate to an output circuit, which re-transforms the signals to an analogue form and applies them to a graphic recorder.

9 Claims, 2 Drawing Figures

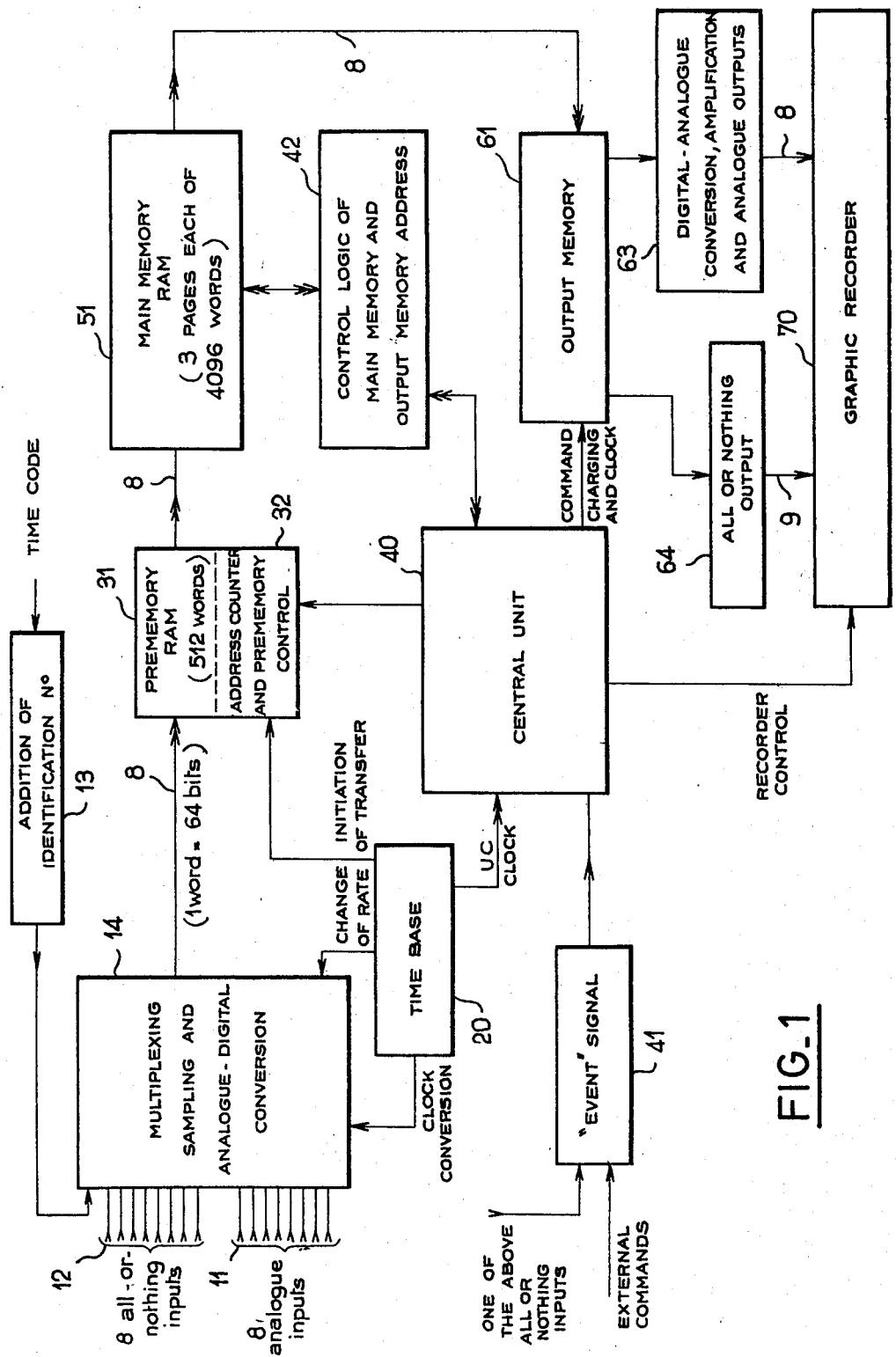
FIG_1

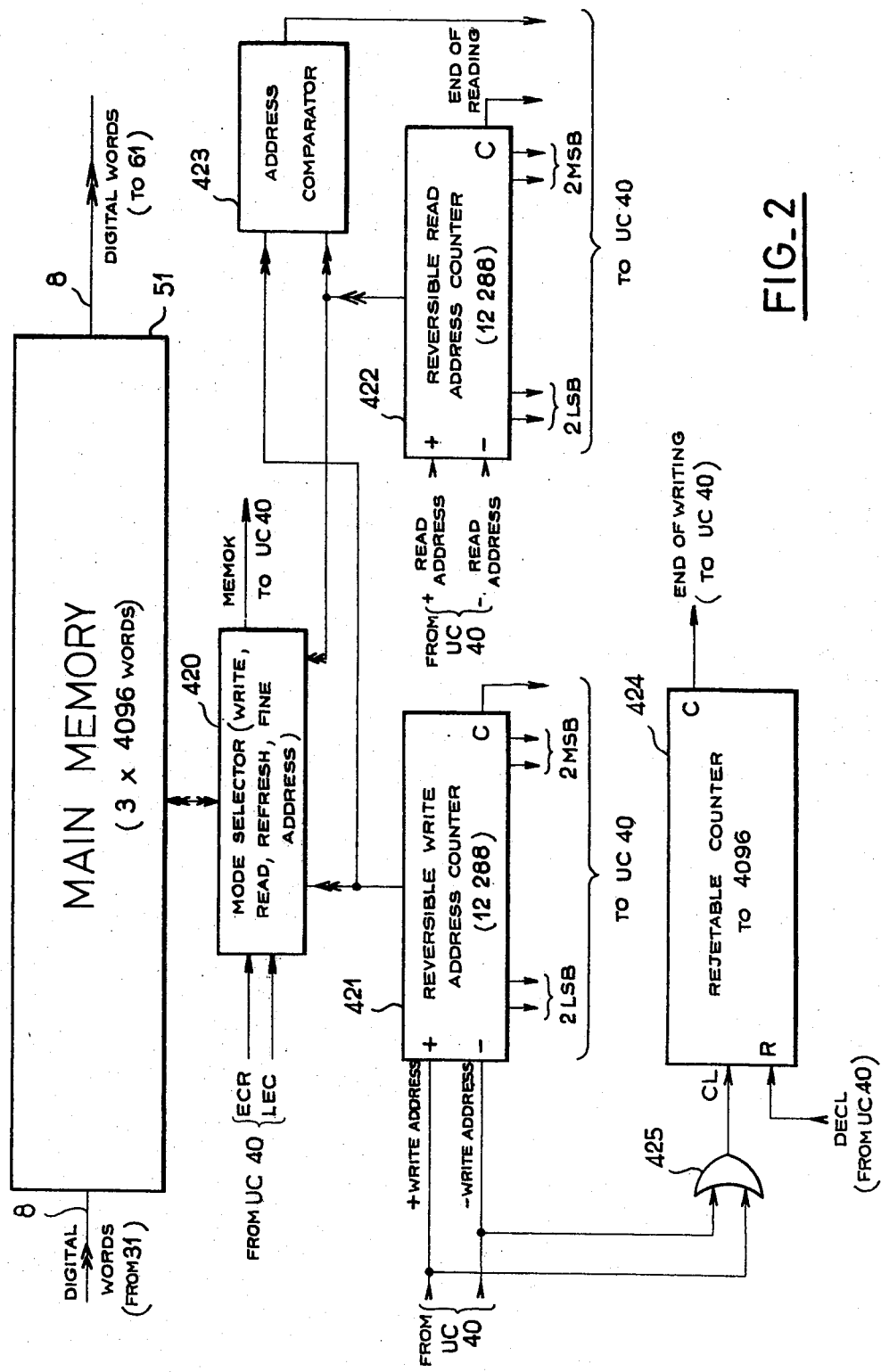
FIG_2

PERTURBATION SIGNAL RECORDER

The invention relates to the graphic recording of electrical quantities (currents and voltages), for the purposes of subsequent analysis. A recording of this type is very useful for determining the causes of perturbations which have affected the quantities monitored.

Hitherto, perturbation signal recorders have used delay means for preserving the recent past of the electrical quantities monitored. These delay means are either the recording paper itself, or a magnetic or electronic memory for example. In both cases, after a perturbation, the apparatus records directly on the paper the electrical quantities monitored. This results in technological and economical constraints which weigh heavily on the performances of the apparatus, especially if a long recording time, a high definition (wide pass band), and excellent reliability are required. Equipment called upon to operate without supervision in very varied types of industrial locations (production and distribution of electricity in chemical production units for example) must meet these requirements.

The present invention intends to improve this situation.

The proposed perturbation signal recorder comprises:
- a time base able to provide at least fast rate signals and slow rate signals,
- an input circuit which receives a series of signals to be monitored, as well as the fast rate signals, which cyclically scans the signals to be monitored according to a cycle defined by the fast rate signals and which converts these signals into a digital word for each scanning cycle,
- a pre-memory which receives the digital words and the fast rate signals and permanently stores the n most recent digital words,
- a main memory of greater capacity than the pre-memory and comprising a digital input connected to the pre-memory, control inputs/outputs and a digital output,
- an output circuit connected to the digital output of the memory circuit and capable of reconverting each digital word supplied by this output into the amplitudes of its constituent analogue signals, as well as of supplying the latter on separate outputs,
- a multi-path graphic recorder connected to the output circuit and capable, on command, of providing a lasting representation of the analogue signals supplied by the output circuit and
- a control arrangement which is connected to the time base circuit and responds to an external event signal representative of a perturbation, on the one hand by initiating the main memory circuit so that it stores at a fast rate the n most recent digital words at the time of this external event as well as the subsequent digital words which appeared during and after this event, on the other hand by causing the memory circuit to supply at the slow rate the digital words stored, in chronological order, whilst at the same time initiating the graphic recorder.

In a preferred embodiment of the invention, the main memory is an addressable memory and the control arrangement comprises main memory control logic able to define normal correspondence between the chronological order of the digital words and their respective storage addresses and comprising a memory interface, a write word address counter, a read word address counter and a digital comparator connected to these two counters in order to indicate that they have reached the same content, which corresponds to the completion of the reading operation for the purposes of reproduction by the graphic recorder, as well as a central control unit which responds to an isolated external event signal by sending to this control logic, on the one hand at a fast rate, write commands associated with commands to step the write word address forwards and on the other hand at a slow rate, read commands associated with commands to stop the read word address forwards.

Very advantageously, the main memory control logic comprises a stepping address counter, the central control unit produces writing until this counter reaches its maximum and the maxima of the two address counters are equal to the same multiple of the maximum of the stepping address counter.

According to another important feature of the invention, the write word address counter is a counter/reversible counter whereof the most significant bit or bits, the least significant bit or bits as well as the carry output are sent to the central control unit. The latter reacts to an external event signal occurring after excitation of the carry output of said write word address counter by sending the latter at fast rate, commands to step the address backwards in increments p where $p \geq 2$ and, at each increment, a write command, according to the least significant bit of the counter and this is at the most until there is a drop to a predetermined limit address defined by the most significant bits of said counter. The read word address counter is also a counter/reversible counter connected like the other to the central unit and the latter normally steps the read word address counter/reversible counter forwards at a slow rate until the address comparator is excited, in order subsequently to read solely to addresses in increments p where $p \geq 2$ until the maximum of the read word address counter/reversible counter is reached and after this to follow the same rate as for the write word address counter/reversible counter.

Preferably, at least the two least significant bits of the write word address counter are sent to the central unit, like those of the read word address counter. The central unit reacts to an external event signal occurring after the redescent of the write word address counter to said predetermined limit address by once more sending to this write word address counter commands to step the address forwards at a fast rate in increments q where $q \geq 4$ and, at each increment, a write command, according to the two least significant bits of the counter and this is at the maximum until there is a return to the maximum of the write word address counter, whereas the central unit then steps the read word address counter forwards at a slow rate, in order to make the latter follow the same rate as for the write word address counter/reversible counter. Advantageously, q is a multiple of p.

Other features and advantages of the invention will become apparent on reading the ensuing detailed description, referring to the accompanying drawings given in order to illustrate as a non-limiting example, a preferred embodiment of the invention and in which:

FIG. 1 illustrates the general electrical circuit of the apparatus according to the invention; and FIG. 2 is a more detailed diagram of the main memory of FIG. 1 and its control circuits.

The illustrated apparatus according to the invention is intended to monitor eight analogue inputs, referred to generally by the reference numeral 11 and eight all or nothing (on/off) inputs, designated generally by the reference numeral 12.

Disregarding input interfaces which are not shown, such interfaces being intended in particular to achieve isolation and impedance matching, the input circuit 14 of the apparatus receives the eight analogue inputs 11 and the eight all or nothing inputs 12, as well as additional all or nothing inputs which will be described hereafter.

A time base circuit 20 is also provided, which in particular provides sampling rate signals and conversion clock signals for the circuit 14.

The eight analogue inputs 11 may be alternating and/or continuous signals, and may represent voltages or currents, in this case currents being converted to voltages by a current/voltage converter (not shown). These analogue inputs are the subject of an analogue/digital conversion, sequentially or in parallel, which provides a six bit digital output for each input. After a burst of conversion clock signals from time base 20, a six bit output appears at the output of the circuit 14. Each of these six bit outputs has added to it two further bits relating to the value of two of the all or nothing inputs, which in all gives an eight bit output. One thus finally obtains a word of eight bit outputs, since there are eight analogue inputs. Consequently, there is room for sixteen all or nothing inputs. Eight of the latter are constitued by inputs 12. Another is defined by a time code generator (days, hours, minutes and seconds), generated externally and received by a circuit 13. The circuit 13 adds to the blanks of the time code a number identifying the apparatus in question. This identifying number may naturally also be applied to a separate all or nothing path or paths. Another all or nothing path (not shown in order to simplify the drawing) receives a signal which represents a break in the information to be recorded (emanating from the output of the counter 424, FIG. 2), in order to show on the graphic recording that there has been a discontinuity with regard to time between the plotted lines which follow. The other available all or nothing paths may be used for operating signals or may remain unused.

The general sampling rate (2 kHz) in the circuit 14 is defined by the time base 20.

The output of the circuit 14 is applied on eight lines to a pre-memory circuit, which forms a digital delay line. The pre-memory circuit comprises a pre-memory proper, designated by the reference numeral 31 and having a capacity of 512 words, and a pre-memory control circuit, designated by the reference numeral 32 and in particular comprising a pre-memory address counter. The memory is a direct access memory in the example illustrated. Naturally, as it is receiving digital words, the circuit 32 is under the control of the time base 20.

The address counter 32 has a capacity of 512. Once it has counted up to 512, which signifies that the pre-memory 31 is full, it returns immediately to its starting point, in order to enable a new digital word to be recorded in the first location of the memory.

Normally (when on stand-by) the apparatus records in the pre-memory 31 the 512 most recent words, which correspond to the 512 most recent values of each of the different inputs. Since the general sampling rate is 2 kHz, the apparatus keeps in the pre-memory 31 the values of these various inputs during the previous 256 milliseconds.

The apparatus becomes active in the presence of a perturbation, detected by the circuit 41. The circuit 41 is responsive either to one of the inputs 11 and 12, preferably one of the all or nothing inputs 12, or to an external control. The circuit 41 produces an "event" signal when a perturbation occurs, the event signal being applied to a central unit 40. The central unit 40 may comprise for example a unit with discrete micro components programmed as a PROM memory and receiving a clock frequency of 2 MHz from the time base 20.

In the presence of an event signal representative of a perturbation, the central unit 40, excited by the circuit 41, firstly acts on the pre-memory 31 through the intermediary of its control circuit 32 so that the digital words stored in the pre-memory 31 are supplied to a main memory 51. Each digital word supplied to the main memory is at the same time or subsequently recorded once more in its place in the pre-memory 31. The central unit 40 also actuates the control logic 42 of the main memory 51 in order that the digital words supplied thereto are recorded. In addition, but at a slower rate, the central unit 40 acts on the control logic 42 in order that it removes from the memory 51 previously recorded digital words in their chronological order of recording in order to supply them to an output memory 61. The output memory 61, which has a capacity of 64 bits for example, supplies the eight groups of six bits associated with the eight analogue inputs to a circuit 63 and supplies the eight bits associated with the all or nothing inputs and the eight operating bits to a circuit 64. On eight parallel paths, the circuit 63 performs a digital/analogue conversion, and amplifies and filters the result for application to analogue paths connected to the corresponding inputs of a graphic recorder 70. In a similar manner, the sixteen available all or nothing paths at the output of the circuit 64 are themselves also applied to the graphic recorder 70. It will be recalled that these paths advantageously carry a time code generator, and an identification of the apparatus concerned. Finally, the central unit 40 starts up the graphic recorder in order that it records on paper at a slow rate the analogue and all or nothing signals taken from the main memory 51, in succession and depending on the sampling instants.

In the embodiment illustrated, the main memory is of the direct access type (RAM). It is arranged in the form of three pages each of 4096 words. Since it is a dynamic RAM memory, its control logic 42 defines the address commands for the memory, as well as the read/write commands and refresh commands.

To this end (FIG. 2), the control logic 42 comprises an interface circuit connected to the main memory 51. The interface circuit 420 receives from the central unit write commands (ECR) and read commands (LEC), refreshes the RAM memory 51, informs the central unit (MEMOK, signifying that the memory 51 is refreshed without errors) and finally undertakes fine addressing (as regards the eight and single bit information elements) of the memory 51.

The function of the logic 42 (FIG. 1) is also to define the correspondence between the addresses in the main memory 51 and the chronological succession of digital words presented to the input of this memory. To this end, the control logic 42 uses modular 12288 counters, which define the addressing of the words in the main memory 51. According to the invention, a reversible write address counter 421 is provided which is stepped forwards by one unit each time the main memory 51 receives a new digital word. A reversible read address counter 422 is also provided, connected like the counter 421 and stepped forward by one unit each time a digital word is read from the main memory 51 and transmitted on its eight output lines to the output memory 61 which records it, this operation taking place at a slow rate under the control of the central unit.

Advantageously, automatic surveillance of the memories is provided, which applies to both the pre-memory 31 as well as to the main memory 51. Each time a digital word is introduced into one of these memories, it is immediately read by the echo mode and the information read and the information introduced is compared bit-by-bit. The correctness of the write and read operations is thus checked. As regards the main memory 51, this automatic surveillance operation is always carried out, even when the memory is not initiated under the control of the central unit by an event signal representative of an external perturbation, for example by writing down as usual in the memory 51, words coming from the pre-memory 31, with forwards stepping of the write address counter 421, but without transmitting information to the output memory 61.

In the embodiment described, the control logic 52 of the main memory comprises, in addition to a read address counter 422 and write address counter 421 having a capacity of 12,288, a modular 4,096 word counter 424, which is not fed back and which can be re-set, i.e. re-set to zero each time the central unit 40 receives an event signal representative of a perturbation. Added to the latter is a twelve-bit address comparator (423), which is capable of comparing the contents of the read address counter (422) and write address counter (421).

In the presence of an event signal representative of a perturbation, the central unit 40 controls re-setting to zero of the "location" counter 424 and of the two address counters 421 and 422.

It will be recalled that the words are continuously written in at a rate of 2 kHz in the pre-memory 31, the oldest word being erased each time a new word is written in, and that the words erased in this way are previously transferred to the main memory 51 for automatic surveillance.

After the appearance of a perturbation, the central unit 40 controls the main memory closely in the following manner:

the main memory 51 firstly records in succession the 512 digital words relating to the input signals from before the perturbation, before or during their erasure for the introduction of a new word into the pre-memory 31. This recording is carried out in chronological order. The location counter 424 counts up to 512 and the write word address counter 421 is stepped forwards by its + counting input (adding) up to the word address 512.

then, in continuity with the preceding stage, the main memory 51 continues to record the words subsequent to the perturbation, the word address counter 421 and the location counter 424 still counting up until the latter reaches its full capacity (4096 locations). It then informs the central unit by way of its carry output C, which stops the writing in of information. If a new perturbation occurs before this happens, the central unit re-sets the location counter 424, by re-setting the latter to zero at its input R. In this case, the counter 424 once more begins to count from the new perturbation, whereas for its part, the counter 421 has continued to step the addresses forwards.

The memory 51, which comprises three pages of 4096 words, is thus able to record digital words without problems for several consecutive perturbations. (It will be noted that the appearance of consecutive perturbations is frequent, in particular when the quantities monitored relate to an electrical distribution system). In the first place, it will be assumed that the perturbations were of an insufficient number to overload the main memory 51 and that the latter has recorded all the desired digital words, the location counter 424 being blocked at its maximum.

From the appearance of the first perturbation, the slow rate operations of reading the memory 51 and of transferring the words read to the output memory have begun. The read address is defined by the counter 422, which advances by one step upon each occasion, a slow clock pulse being applied to the latter by the central unit on its adding + input. The words applied in this way at a slow rate to the output memory are processed in the manner already described, so that each is finally translated into a set of contemporary points on the graphic recorder 50. When the counter 422 reaches the address at which the counter 421 has stopped, the address comparator 423 indicates to the central unit that reading has finished. The apparatus thus returns to the stand-by state, awaiting a new perturbation.

Things become complicated if the perturbations occur in succession at a rate such that the main memory 51 is no longer able to record all the information without overloading. In this case, the control logic 42 informs the central unit 40, the carry output of the counter 421 being excited.

From this time, if the word counter 424 has not reached its maximum capacity limit, the central unit applies the write clock pulses (2 kHz) to the reverse counting input of the counter 421. The latter will thus go through the addresses in the opposite direction. However, the central unit emits a write command in the direction of the circuit 420 solely for one address out of two. In this way, the rate of sampling the digital words previously recorded is divided by two, as the address moves back. At the same time, the digital words subsequent to the saturation of the memory 51 are recorded at half the sampling rate (1 kHz), (at a rate of one word out of two). The central unit easily selects one address out of two since it knows the least significant bit of the counter 421. This process of stepping the address backwards with sampling at half the rate occurs solely on the two last pages of the memory 51, the first page still being recorded at a rate of 2 kHz. The fact that stepping the address backwards reaches the first page of the memory is detected by the central unit by means of the two most significant bits of the counter 421.

In addition to the 4096 words initially recorded at a rate of 2 kHz, the main memory 51 may thus once more record 8192 locations at a rate of 1 kHz. The total number of words recorded is not modified, but it will be noted that the first 4096 words correspond to 2048 recording periods, whereas the 8192 words recorded in the second place correspond to 8192 periods. Naturally, during the reading of the information in the main memory 51, this modification applied to the write address counter is taken into account and the read address counter, which is still delayed with respect to the former, is controlled in a manner similar to that which was undertaken for the write address counter. To this end, the least significant bit (LSB) and the two most significant bits (MSB) as well as the carry output C of the counter 422 are transmitted to the central unit 40.

More precisely, reading occurs by stepping the address of the counter 422 forwards until the address comparator 423 indicates that it is equal to that of the counter 421. In this case, if the central unit has recorded (by means of a trigger which is not shown) that the memory 51 has been saturated, this signifies that after this point, only one word out of two is located in the chronological sequence of the words read previously. The central unit thus continues to step the counter 422 forwards, but by giving the read commands solely every other time, taking into account the least significant bit of the counter 422. This takes place until the maximum of the counter 422 is reached, after which the central unit steps this counter backwards, by applying the read clock pulses at a slow rate (100 Hz) to its reverse-counting input. Reading once more takes place every other time, but in an intercalated manner with respect to the preceding phase, in order to respect the chronological order of the words. As for the writing, this process of stepping the read address backwards takes place on the last two pages of the memory 51, stoppage of reading when stepping the address backwards being determined according to the two most significant bits of the counter 423.

If, after having carried out the above-described write operations, the memory is once more saturated and a new perturbation still occurs, or the counter 424 does not stop at its maximum, operation of the write address counter and of the memory 51 is once more divided into two. One preserves the 4096 initial words recorded at a rate of 2 kHz (for 2048 periods), and one also preserves half (namely 4096) of the locations subsequently recorded at a rate of 1 kHz, namely 4096 recording periods. On the other hand, the write address counter is re-set to the advance mode, the write clock pulses once more being applied to its + input. The central unit 40, which receives the two least significant bits (2 LSB) of the counter 421 now controls writing solely on one occasion out of four (i.e. at a rate of 0.5 kHz). Since all these changes in the writing speed are memorised in the central unit, by taking into account the intersections or equalities of address indicated by the comparator 423, it is easy for the central unit to control reading in order to follow the chronological order of writing faithfully without in any way mixing the digital words of an adjacent address recorded at different periods. Naturally, the two least significant bits of the counter 422 are transmitted to the central unit in order to ensure reading on one occasion out of four.

In the embodiment described, writing at a quarter rate (500 Hz) takes place at 4096 locations which are taken from the two last pages of the memory 51. Preferably, the selection of writing on one occasion out of four is carried out in order to eliminate one out of two of the words recorded when the counter 421 is stepped backwards (rather than the remainder of those initially recorded in the two last pages when this counter 421 is stepped forwards). In all, the apparatus may thus record 4096 locations at 2 kHz (therefore 512 before the perturbation), 4096 locations at 1 kHz and 4096 locations at 500 Hz. The total acquisition time is therefore 14,336 periods. This feature of the invention is particularly important, in the case where perturbations frequently follow each other at a fast rate. Most of the time, a minor perturbation causes greater perturbations and it is essential to be able to follow all the signals to be monitored throughout the various perturbations.

It will be observed that the information applied to the graphic recorder 70 is extracted from digital words, and is therefore by nature punctuate and instantaneous. The said filtering circuits, incorporated in particular in the circuit 63, transform these punctuate indications as regards their envelope, completely or partially, which gives signals recorded in an easily exploitable form.

Naturally, it is possible to provide numerous variations in the apparatus of the invention. For example, it is very simple to incorporate current/voltage converters at the interfaces (not shown) of the analogue inputs 11. It is also possible to replace the pre-memory 31 or even the main memory 51, of the direct access type, by memories of the shift register type. It is also very simple to incorporate adjustable gain amplifiers in the inputs. The reliability of the entire apparatus is very good, on account of the automatic surveillance of the write/read process in the memories. Advantageously, the central unit 40 is provided with a "watchdog" device, which monitors its operation and in the case of any anomaly, the apparatus is provided with an output line able to indicate to any central monitoring station that it is no longer able to operate, which may occur for example when the graphic recorder has used up its reserve of paper. Finally, in order to multiply the capacity as regards the number of recording paths, it is extremely simple to connect several apparatus according to the present invention in parallel, whereof only one of which, which acts as the "master" is initiated by the signal representative of the perturbation, whereas the others are initiated by the former in the slave mode. Similarly, in order to increase the memory capacity, it is possible to provide four pages of memory instead of three.

The apparatus according to the invention provide a dated and identified recording of generally electrical quantities, as regards their values before, during and after a perturbation. They relate in particular to the monitoring of systems for the production and distribution of electrical energy, for which they make it possible:

to know the origin of a fault;
to follow the development of the fault and its repercussions in the system;
to check the correct operation of the circuits for protecting the system; and
to control the operation and position of the protection and control members.

What is claimed is:

1. Perturbation signal recorder, characterised by the fact that it comprises, in combination:
    a time base providing at least fast fate signals and slow rate signals,
    an input circuit, receiving a series of signals to be monitored and said fast rate signals, said input circuit cyclically scanning said signals to be monitored according to a cycle defined by said fast rate signals and converting said signals to be monitored into a digital word for each scanning cycle,
    a pre-memory receiving said digital word and said fast rate signals and storing the n most recent digital words,
    a main memory having a greater capacity than said pre-memory and comprising: control logic inputs- /outputs, a digital output, and a digital input connected to said pre-memory, an output circuit connected to said digital output of said main memory, said output circuit re-converting each digital word supplied by said output into analogue signals which are applied to separate outputs, a multi-path graphic recorder connected to the output circuit, said recorder providing on command a representation of said analogue signals supplied by said output circuit, and a control arrangement connected to said time base circuit and responsive to an external event signal representative of a perturbation to initiate said main memory circuit to store, at a fast rate, the n most recent digital words preceding the time of said external event and subsequent digital words which appeared during and after said external event, and to cause said main memory circuit to supply stored digital words, at a slow rate and in chronological order, whilst initiating said graphic recorder.

2. Recorder according to claim 1, wherein an event signal input is provided, connected to said central unit, and receiving an external control input or an all or nothing input to said input circuit.

3. Recorder according to claim 1, wherein an all or nothing input to said input circuit receives a time code sequential signal.

4. Recorder according to claim 1, wherein an all or nothing input to said input circuit receives sequential information for the identification of apparatus.

5. Recorder according to claim 1, wherein said main memory is an addressable memory and said control arrangement comprises main memory control logic defining normal correspondence between the chronological order of said digital words and their respective storage addresses and comprising a memory interface, a write word address counter, a read word address counter and a digital comparator connected to said two counters in order to indicate that they have reached the same content, which corresponds to the normal completion of the reading operation for the purposes of reproduction by said graphic recorder, and a central control unit responsive to an isolated external event signal to send to said control logic, at a fast rate, write commands associated with commands to step the write word address forwards and, at a slow rate, read commands associated with commands to step the read word address forwards.

6. Recorder according to claim 5, wherein said main memory control logic comprises a stepping address counter, said central control unit producing writing until said stepping address counter reaches its maximum, and the capacity of said two address counters being equal to the same multiple of the capacity of said stepping address counter.

7. Recorder according to claim 6, wherein said write word address counter is a reversible counter whereof the most significant bits, the least significant bit and the carry output are sent to said central control unit, wherein said central control unit is responsive to an external event signal occurring after excitation of the carry output of said write word address counter to send to the latter, at said fast rate, commands to step the address backwards in increments p where $p \geq 2$, and at each increment, a write command, according to the least significant bit of the counter until there is a drop to the predetermined address defined by the most significant bits of said counter, wherein said read word address counter is also a reversible counter connected like said write word address counter to said central unit, and wherein said central unit normally steps forward at said slow rate the read word address counter until the time of excitation of the address comparator, in order to subsequently read solely addresses in increments of p until the maximum of said read word address counter is reached and thereafter to follow the same rate as for the write word address counter.

8. Recorder according to claim 7, wherein the two least significant bits of said write word address counter are sent to said central unit and wherein said central unit is responsive to an external event signal occurring after said write word address counter drops back to said predetermined limit address, by once more sending to this write word address counter commands to step the address forwards at a fast rate in increments q where $q \geq 4$ and at each increment, a write command, according to the two least significant bits of said counter until there is a return to the maximum of said write word address counter, whereas said central unit steps said read word address counter forwards at said slow rate in order to cause the latter to follow the same rate as for the write word address counter.

9. Recorder according to one of claims 6 to 8, wherein an all or nothing input to said input circuit receives the output of said stepping address counter.

* * * * *